(12) United States Patent
Niederberger

(10) Patent No.: US 9,685,866 B2
(45) Date of Patent: Jun. 20, 2017

(54) SHUNT DRIVER CIRCUIT AND METHOD FOR PROVIDING AN OUTPUT SIGNAL

(71) Applicant: ams AG, Unterpremstaetten (AT)

(72) Inventor: Mark Niederberger, Einsiedeln (CH)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/005,965

(22) Filed: Jan. 25, 2016

(65) Prior Publication Data

US 2016/0218622 A1 Jul. 28, 2016

(30) Foreign Application Priority Data

Jan. 26, 2015 (EP) .................................... 15152506

(51) Int. Cl.
| | |
|---|---|
| *H02M 3/158* | (2006.01) |
| *G05F 3/20* | (2006.01) |
| *H02H 7/00* | (2006.01) |
| *H02M 3/335* | (2006.01) |
| *G01R 15/14* | (2006.01) |

(52) U.S. Cl.
CPC .......... *H02M 3/158* (2013.01); *G01R 15/146* (2013.01); *G05F 3/20* (2013.01); *H02H 7/00* (2013.01); *H02M 3/335* (2013.01)

(58) Field of Classification Search
CPC combination set(s) only.
See application file for complete search history.

(56) References Cited

U.S. PATENT DOCUMENTS

| | | |
|---|---|---|
| 6,141,193 A | 10/2000 | Mercer |
| 2012/0155123 A1 | 6/2012 | Tang et al. |
| 2014/0077788 A1 | 3/2014 | Vemula |

FOREIGN PATENT DOCUMENTS

| | | |
|---|---|---|
| EP | 2730990 A1 | 5/2014 |
| EP | 2733564 A2 | 5/2014 |
| JP | S54134052 U | 9/1979 |
| JP | S55178798 U | 12/1980 |
| JP | H10261950 A | 9/1998 |
| JP | 2014112350 A | 6/2014 |
| WO | 2008/119996 A1 | 10/2008 |

*Primary Examiner* — Clayton E Laballe
*Assistant Examiner* — Jas Sanghera
(74) *Attorney, Agent, or Firm* — McDermott Will & Emery LLP

(57) ABSTRACT

In an embodiment a shunt driver circuit has a first and a second connection terminal (N1, N2) forming a two-wire interface (N1, N2), the first connection terminal (N1) being prepared to receive a supply power and to provide an output signal (Sout), the second connection terminal (N2) being connected to a reference potential terminal (10), an Operational Transconductance Amplifier, OTA, (11) comprising a first input coupled to the first connection terminal (N1), a second input for receiving a first reference signal (Sref1) and an output (12) for providing a signal (S12) depending on a difference between an input signal on the first input and the first reference signal (Sref1), a capacitor (C1) coupled between the output (12) and the first input of the OTA (11) via the second connection terminal (N2) in a control loop, and a controlled current source (13) coupled between the output (12) of the OTA (11) and the second connection terminal (N2). The controlled current source (13) is controlled to provide an additional current (Ifall) during a transient phase of the output signal (Sout).

14 Claims, 3 Drawing Sheets

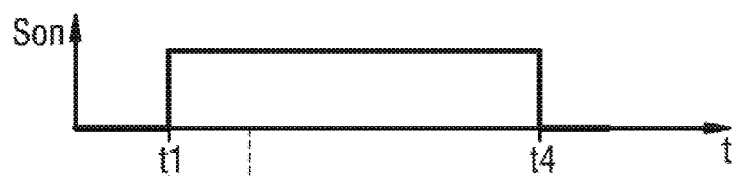
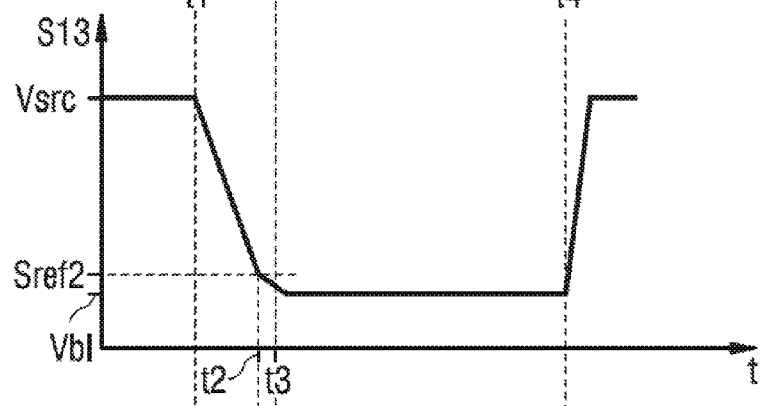
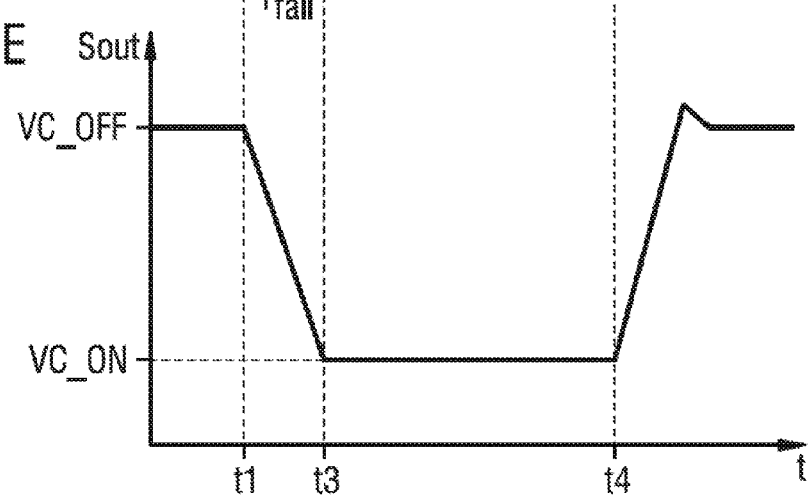

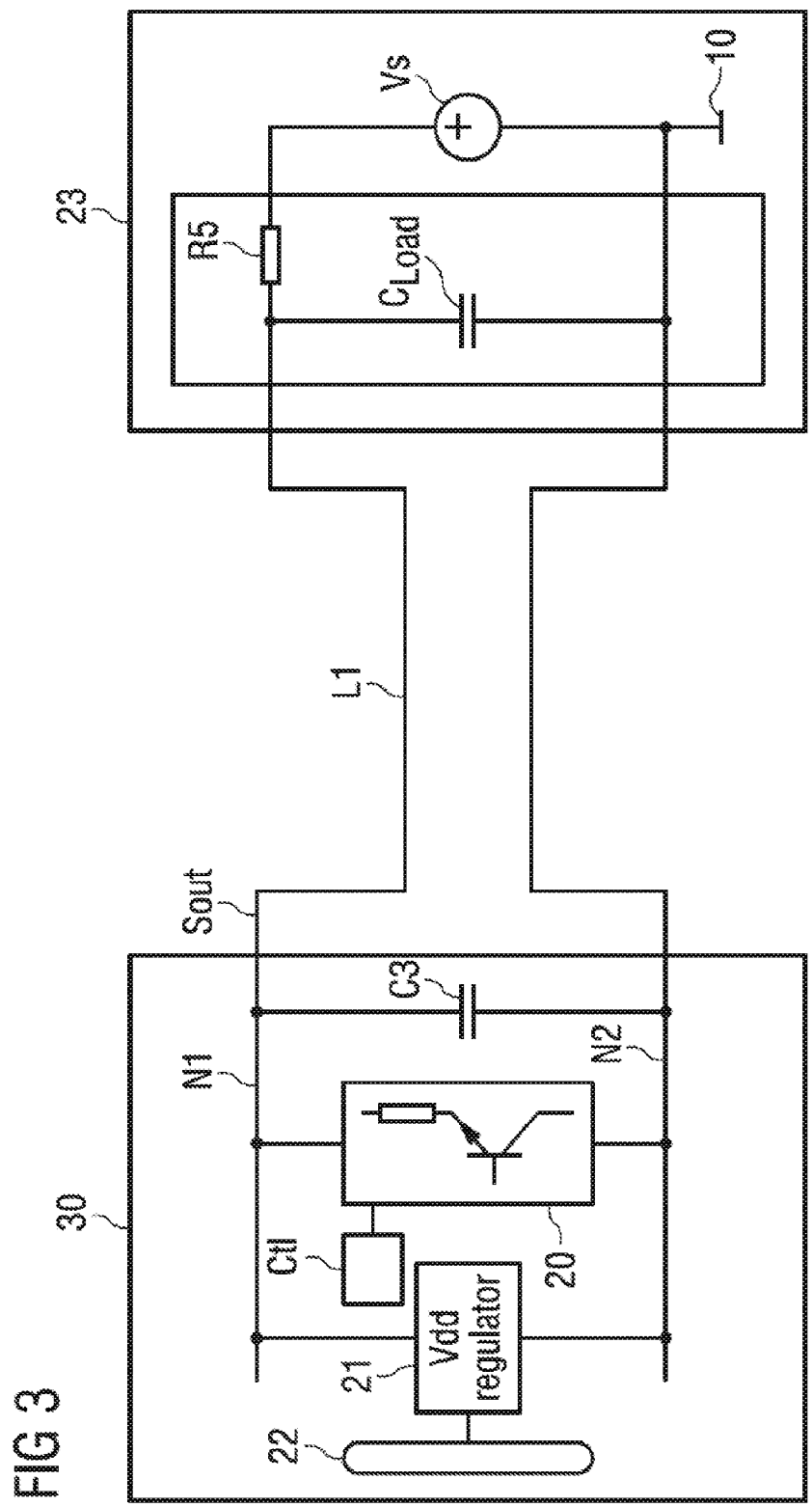

SHUNT DRIVER CIRCUIT AND METHOD FOR PROVIDING AN OUTPUT SIGNAL

The present application relates to a shunt driver circuit and to a method for providing an output signal.

BACKGROUND OF THE INVENTION

A shunt driver, also called a shunt regulator, is a voltage regulator often employed within a DC power supply. The shunt driver begins conducting at a specified voltage. It conducts as much current as required to hold its terminal voltage to a specified voltage by diverting excess current from a non-ideal power source to ground, often through a relatively low-value resistor to dissipate the excess energy.

A shunt driver can be used, for example, to drive a two-wire interface in industrial sensor applications. The two wires are employed for power supply of the shunt driver and a connected sensor, as well as, for communication. By this, the data provided by the sensor which has for example a digital output is transmitted. One wire serves as a reference potential, while the second wire serves for the supply and the output of the sensor.

In an off state of the output, only the power supply for the sensor, for example a supply current, is drawn from the two-wire interface. In an on state, the output is pulled down to a lower output voltage level by means of the shunt driver. Accordingly, the shunt driver is active during the on state of the output and not active during the off state.

Industrial sensors may be connected to their load and/or supply via very long cables which can be up to several 100 meters long. Such cable may have a large capacitance and inductance per unit length. Therefore, the impedance of the cable, as well as, the propagation delay of the cable may have a large range of variance. Also, the load itself can vary in a large range, can be purely resistive or have a large capacitive or inductive component. Furthermore, reflections occur due to a mismatch between a load and a cable impedance, i.e. the transmission line impedance and the long length of the cable. The reflected signal causes problems whenever the load impedance is much higher than the transmission line impedance of the cable. In these cases, the reflected wave will pull down the output below the minimum required supply voltage, which effect is called an undershoot. This can only be avoided if the voltage slope during a transition from the off state to the on state inclines not too steep. The shunt driver consequently has to fulfil the following requirements:

Prevent any undershoots of the output voltage in order to supply the sensor;
Offer a stable behavior for all kinds of loads connected to the output of the sensor.

In general, shunt drivers are difficult to keep stable and at the same time realize a fast step response. Known active shunt drivers are based on an operational transconductance amplifier with a capacitive load in its control loop and two transistors coupled to the two-wire interface and the amplifier. These shunt drivers have a dominant pole at a very low frequency which slows down the transition between on and off state. Therefore, an objective technical problem consists in providing a shunt driver circuit and a corresponding method which achieve fast transition times without any undershoot in order to cope with long transmission lines.

The objective is achieved by the subject matter of the independent claims. Embodiments and developments are defined in the dependent claims.

The definitions as described above also apply to the description of the below embodiments unless stated otherwise.

SUMMARY OF THE INVENTION

In one embodiment a shunt driver circuit comprises a first and a second connection terminal forming a two-wire interface, an Operational Transconductance Amplifier, OTA, a capacitor and a controlled current source. The first connection terminal is prepared to receive a supply power and to provide an output signal, the second connection terminal is connected to a reference potential terminal. The OTA has a first input coupled to the first connection terminal, a second input for receiving a first reference signal and an output for providing a signal depending on a difference between an input signal on the first input and the first reference signal. The capacitor is coupled between the output and the first input of the OTA via the second connection terminal in a control loop. The controlled current source is coupled between the output of the OTA and the second connection terminal. Therein the controlled current source is controlled to provide an additional current during a transient phase of the output signal.

The OTA with a capacitive load in form of the capacitor in the control loop is employed together with the controlled current source to achieve a smooth transition of the output signal. The controlled current source is active as long as the output signal has not reached a settled value.

By means of the controlled current source in combination with the OTA a faster transition is achieved without undershooting a minimum level of the output signal. The shunt driver circuit therefore is enabled to cope with long transmission lines which can be coupled to the two-wire interface.

The output signal is provided as a multilevel signal which has a first and at least a second signal level. In case the output signal has exactly the first and the second signal level, the output signal is provided as a binary signal. A change of the output signal from the first to the at least one second signal level or vice versa is defined as a transition.

In an exemplary embodiment, the OTA is chosen to have a low transconductance value in order to have a dominant pole at a low frequency with still a reasonable capacitive load of the OTA. Due to the low transconductance, a maximum current at the output of the OTA is much smaller than the current provided by the controlled current source. Therefore, the transition of the output signal is accelerated.

The dominant pole is a term used in the field of feedback control systems. The dominant pole accordingly characterizes the pole in a frequency transfer function of a feedback control system which pole is located at the lowest possible frequency.

The OTA with the capacitor in the control loop between the output and the first input of the OTA represents a feedback control system.

Optionally, an OTA-C low pass filter is used to realize the dominant low frequency pole in the OTA control loop.

The amount of the additional current is limited so that any undershoot of the output signal is prevented.

In one embodiment the shunt driver circuit further comprises a first switch and a voltage follower. The first switch is connected between the output of the OTA and the first connection terminal. The voltage follower is coupled between the first and the second connection terminal. The voltage follower has a control input which is connected to the output of the OTA.

If the first switch is closed, the shunt driver circuit is deactivated and the output signal assumes the first signal level. This first signal level is propagated via the two-wire interface. The first signal level represents, for example, the digital value 1. In the deactivated or off state of the shunt driver circuit, the voltage follower is controlled such that it is non-conducting. Consequently, the level of a voltage on the first connection terminal i.e. the level of the output signal corresponds to the level of the supply power.

If the first switch is open, the shunt driver circuit is activated, so that it is in the on state. By means of the signal at the output of the OTA, the voltage follower is controlled in a conductive state. The controlled current source is switched on concurrently. Consequently, the capacitor is discharging and a level of the voltage on the first connection terminal decreases in a linear way until the output signal assumes the second signal level. The controlled current source is controlled to be active as long as the output signal has not reached the second signal level and is then switched off. This means that the controlled current source is switched off and the current provided decays to zero when the output signal gets close to the value of the second signal level. Due to the switching off of the controlled current source, this current source has no impact on the accuracy of the second signal level provided via the output signal over the two-wire interface. This is still achieved even if the OTA has a very low value of transconductance.

By means of the controlled control source and the additional current, the control input of the voltage follower is pulled down so that the transition time of the shunt driver circuit from an off state to an on state, which corresponds to the transition of the output signal from the first to the second signal level, is reduced.

In another embodiment, the shunt driver circuit comprises a resistor divider which is connected between the first and the second connection terminal. The resistor divider has a first and a second resistor connected in series to each other. A connection node between the first and the second resistor is coupled to the first input of the OTA.

By this, the first input of the OTA is supplied with the output signal which is scaled with the scaling factor of the resistor divider. The first reference signal present at the second input of the OTA is configured such that it corresponds to the second signal level of the output signal which is also scaled with the scaling factor of the resistor divider. Consequently, as long as the output signal has not reached the second signal level, the signal at the output of the OTA controls the voltage follower in a conductive state. In case of the output signal being provided as a multilevel signal, the first reference signal corresponds to a desired value of a third signal level of the output signal, for example.

In a further embodiment, the shunt driver circuit comprises a circuit for generating a control signal for controlling the controlled current source. The control signal is generated as a function of a signal at an output terminal of the voltage follower and a second reference signal.

The control signal is generated such that the controlled current source is switched on as soon as a transition from the first to the second signal level of the output signal is initiated. Shortly before the output signal reaches the second signal value, the current source is switched off. The second reference signal comprises, for example, a voltage value that is slightly above a voltage value of the second signal level of the output signal. Consequently, when the signal at the output of the OTA is pulled down to the level of the second reference signal, the controlled current source is switched off.

Switching off of the controlled current source prevents the second signal level of the output signal from having an offset.

The circuit for generating a control signal can be implemented as a comparator, for instance. The control signal is consequently generated as a function of a difference between the signal at the output terminal of the voltage follower and the second reference signal.

In a development the shunt driver circuit further comprises a current limiter circuit coupled to the second connection terminal and to another terminal of the voltage follower.

The current limiter circuit can be realized as a transistor or as another current source.

In another embodiment, the first reference signal is provided as a function of the output signal.

In a development of the shunt driver circuit the voltage follower comprises a first transistor realizing a first voltage follower stage. A control input of the first transistor forms the control input of the voltage follower.

In a further development of the shunt driver circuit, the voltage follower additionally comprises at least a second transistor which is coupled between the first and the second connection terminal. The second transistor realizes at least one second voltage follower stage. It has a control input which is connected to a terminal of the first transistor.

In this development the second voltage follower stage is coupled as a cascade with respect to the first voltage follower stage.

The proposed shunt driver circuit may be implemented using just the first voltage follower stage. The second voltage follower stage is optional.

In another implementation example, more voltage follower stages may be provided in addition to first and second voltage follower stages. In this case each stage comprises a transistor being coupled in a cascade fashion to the transistor of the preceding voltage follower stage. The number of voltage follower stages used to implement the voltage follower depends on a desired driving power of the output of the shunt driver circuit.

In one embodiment a sensor arrangement has a shunt driver circuit as described above, a control logic circuit, a regulator circuit and a sensor. The control logic circuit is coupled to the shunt driver circuit and is prepared to provide an activation signal to control the first switch. The regulator circuit is coupled between the first and the second connection terminal. The regulator circuit is prepared to provide a regulated supply voltage to the sensor arrangement. The regulated supply voltage is provided as a function of the supply power received via the two-wire interface. The sensor is coupled between the first and the second connection terminal and is configured to provide a digital sensor signal.

Whenever the sensor which is coupled to the two-wire interface detects an event which is reflected in the sensor signal, the control logic circuit provides the activation signal to the shunt driver circuit, by means of which the first switch is opened. Upon activation of the shunt driver circuit, the output signal changes from first to second signal level. This information is transmitted via the two-wire interface.

Due to the transition of the output signal realized by the shunt driver circuit according to the proposed principle, even long transmission cables can be connected to the two-wire interface without affecting the output signal.

In one embodiment a transmission arrangement has a sensor arrangement as described above, a two-wire transmission line connected to the first and the second terminal of the shunt driver circuit, and a controller unit. The controller unit is connected to the two-wire transmission line. The controller unit has an energy source for providing the supply power and a device for receiving the output signal.

The controller unit provides the supply power to the sensor arrangement with the shunt driver circuit. Furthermore, the controller unit receives the output signal which reflects data or information provided by the sensor and represented by first and second signal levels of the output signal.

By means of the proposed arrangement, a slope of the output signal during a transition of the output signal from the first to the second signal level can be controlled independently of any stability requirements of the control loop of the OTA.

In one embodiment a method for providing an output signal by means of a two-wire interface comprises the following steps:

supplying power to a shunt driver circuit via the two-wire interface, providing, by the shunt driver circuit, an output signal on the two-wire interface, the output signal having a first signal level, providing, by a control logic circuit, an activation signal to the shunt driver circuit, providing, by the shunt driver circuit, the output signal on the two-wire interface (N1, N2), the output signal having a second signal level, wherein during a transition of the output signal from the first signal level to the second signal level an additional current is provided within the shunt driver circuit.

The provision of the additional current during the transition of the output signal accelerates said transition without an undershoot of the second signal level.

In an exemplary implementation the method is executed using the proposed shunt driver circuit and the sensor arrangement.

In a development the activation signal is provided upon detection of activity by a sensor connected to the two-wire interface.

The sensor comprises, for example, a proximity sensor, a capacitive proximity sensor or a photo sensor.

In a further development, the additional current is adapted to a level of the output signal and is switched off shortly before the output signal assumes the second signal level.

By adapting the amount of additional current to the level of the output signal, over-acceleration of the transition of the output signal is prohibited.

In a development the output signal is provided as a multilevel signal.

BRIEF DESCRIPTION OF THE DRAWINGS

The text below explains aspects of the proposed shunt driver circuit and transmission arrangement in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures.

Therein

FIGS. 2A to 2E show signal diagrams relating to the shunt driver circuit depicted in FIG. 1, and FIG. 3 shows a transmission arrangement according to the proposed teaching.

DETAILED DESCRIPTION

Figure 1:
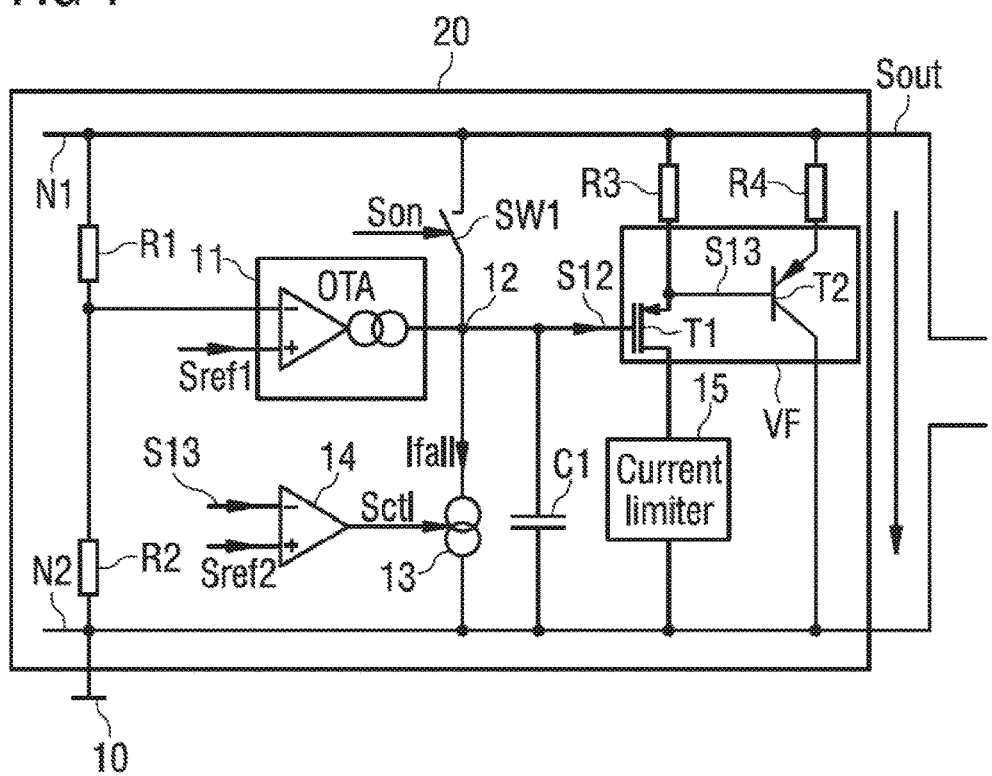
FIG. 1 shows a shunt driver circuit according to the proposed teaching.

FIG. 1 shows a shunt driver circuit according to the proposed teaching. The shunt driver circuit 20 has a first connection terminal N1 and a second connection terminal N2 which form a two-wire interface. The first connection terminal N1 is prepared to receive a supply power and to provide an output signal Sout. The second connection terminal N2 is connected to a reference potential terminal 10. The shunt driver circuit further has an operational transconductance amplifier, OTA, 11, a controlled current source 13, a first switch SW1, a capacitor C1, and a voltage follower VF. Furthermore, the shunt driver circuit 20 has a resistor divider R1, R2 having a first resistor R1 and a second resistor R2 which are connected in series.

The resistor divider R1, R2 is coupled between the first and the second connection terminal N1, N2. A connection point between the first and the second resistor R1, R2 is coupled to a first input of the OTA 11. A second input of the OTA 11 is supplied with a first reference signal Sref1. The OTA 11 has an output 12 which is connected via the first switch SW1 to the first connection terminal N1. The capacitor C1 is connected to the output 12 of the OTA 11 and to the second connection terminal N2. Consequently, a control loop is formed between the output 12 of the OTA 11 and its first input via the capacitor C1 and the second resistor R2.

The controlled current source 13 is coupled to the output 12 of the OTA 11 and to the second connection terminal N2. The controlled current source 13 is controlled by a control signal Sctl which is provided by a circuit 14 for providing the control signal Sctl. An additional current Ifall is provided by the controlled current source 13.

The voltage follower VF in this example has a first voltage follower stage comprising a first transistor T1 and a second voltage follower stage comprising a second transistor T2. As already mentioned above, the number of voltage follower stages may vary depending on the desired power of the output signal Sout.

The first transistor T1 is realized, for instance, as a p-channel metal oxide semiconductor, PMOS, transistor. It is coupled with its control input, namely its gate terminal, to the output 12 of the OTA 11. The gate terminal receives a signal S12 provided at the output of the OTA 11. A source terminal of the first transistor T1 is connected via a third resistor R3 to the first connection terminal N1. A drain terminal of the first transistor T1 is coupled to the second connection terminal N2. Optionally, a current limiter circuit 15 can be connected between the drain terminal of the first transistor T1 and the second connection terminal N2 to limit the current flow through the first transistor T1. The second transistor T2 is realized, for instance, as a pnp-bipolar transistor. A base terminal representing a control input of the second transistor T2 is coupled to the source terminal of the first transistor T1. The base terminal of the second transistor T2 receives a signal S13. An emitter terminal of the second transistor T2 is coupled to the first connection terminal N1. Optionally a fourth resistor R4 can be connected between the emitter terminal of the second transistor T2 and the first connection node N1 for limiting the current through the second transistor T2 or for measuring such current. A collector terminal of the second transistor T2 is connected to the second connection node N2.

The circuit 14 which generates the control signal Sctl for the controlled current source 13 receives on its first input the signal S13 which occurs at the base terminal of the second transistor T2. On its second input the circuit 14 receives a second reference signal Sref2.

The output signal Sout in the depicted example is a binary signal which assumes one of two states or signal levels, namely a first signal level or a second signal level. The first reference signal Sref1 corresponds to the second signal level of the output signal Sout scaled with the scaling factor of the resistor divider R1, R2. The second reference signal Sref2 is supplied as a function of the second signal level of the output signal Sout. The first switch SW1 is controlled by an activation signal Son.

The dynamic behaviour of the proposed shunt driver circuit 20 will be explained below in connection with FIGS. 2A to 2E.

FIGS. 2A to 2E each show a signal diagram corresponding to the shunt driver circuit 20 depicted in FIG. 1.

FIG. 2A shows the activation signal Son with respect to time t. At a first point in time t1, the activation signal Son assumes a high state which opens the first switch SW1. The shunt driver circuit 20 consequently is in its on state. Said switch SW1 remains open until a fourth point in time t4 at which the activation signal Son goes back to a low state which closes the first switch SW1. The shunt driver circuit 20 is in its off state.

FIG. 2B shows the signal S13 at the base terminal of the second transistor T2 in relation to time t. As soon as the first switch SW1 is opened at the first point in time t1, the signal S13 due to a pull down of the gate terminal of the first transistor T1 decreases from a first value Vsrc in a linear way to the voltage value of the second reference signal Sref2. The level of the second reference signal Sref2 is assumed at a second point in time t2. The voltage level of the signal S13 decreases further to its minimum value Vbl which is reached at a third point in time t3. The signal S13 remains at this minimum value until the fourth point in time t4 at which point it raises its level to the first value Vsrc.

FIG. 2C shows the control signal Sctl in relation to time t. It can be seen that at the first point t1, which coincides with the opening of the first switch SW1, the control signal Sctl assumes a high value. At the second point in time t2 the control signal Sctl assumes a low value.

FIG. 2D shows the additional current Ifall in relation to time t. As a consequence of the control signal Sctl, the additional current Ifall is switched on at the first point in time t1 and is switched off at the second point in time t2. The additional current Ifall consequently decays to zero at the third point in time t3.

The time of a transition of the output signal Sout amounts to the time between the first and the third point in time t1, t3 and is marked with Tfall.

FIG. 2E shows the resulting transition of the output signal Sout in relation to time t. The output signal Sout has a first signal level VC_OFF and a second signal level VC_ON. Before the switch SW1 is opened, the output signal Sout is at its first signal level VC_OFF. Upon activation by the activation signal Son, a transition of the output signal Sout to the second signal level VC_ON is initialized. The output signal Sout gradually decreases until it reaches its second signal level VC_ON at the third point in time t3. No undershoot occurs due to the moderate slope of the transition. At the fourth point in time t4 when the first switch SW1 is closed, the level of the output signal Sout rises back to the first signal level VC_OFF. The first signal level VC_OFF therein represents, for example, a digital one, whereas the second signal level VC_ON represents in this example a digital zero. The second signal level VC_ON is lower than the first signal level VC_OFF.

The additional current Ifall advantageously helps in achieving a transition of the output signal Sout having an optimized slope which is steep enough to realize fast transfer of sensor data and at the same time flat enough to prevent any undershoot.

FIG. 3 shows a transmission arrangement according to the proposed teaching. The transmission arrangement comprises a shunt driver circuit 20 which is comprised by a sensor arrangement 30, a controller unit 23 and a two-wire transmission line L1 which connects the sensor arrangement 30 to the controller unit 23.

The sensor arrangement 30 has the shunt driver circuit 20 as described above under FIG. 1, a control logic unit Ctl, a regulator circuit 21 and a sensor 22. The control logic circuit Ctl is coupled to the shunt driver circuit 20 and is enabled to provide the activation signal Son which controls the first switch SW1. The regulator circuit 21 is coupled between the first and the second connection terminal N1, N2. The regulator circuit 21 provides a regulated supply voltage to the sensor arrangement 30. The regulated supply voltage is provided as a function the supply power received via the two-wire interface N1, N2. The sensor 22 is coupled between the first and the second connection terminal N1, N2. It is configured to provide a digital sensor signal.

The two-wire transmission line L1 is connected to the first and the second connection terminal N1, N2. It can, for instance, be as long as 200 m.

The controller unit 23 comprises an energy source Vs which provides the supply power to the sensor arrangement 30 and a device R5 for receiving the output signal Sout.

Whenever the sensor 22 detects activity, the control logic circuit Ctl provides the activation signal Son so that the first switch SW1 of the shunt driver circuit 20 is opened. The shunt driver circuit 20 is activated and effects transition of the output signal Sout from the first signal level VC_OFF to the second signal level VC_ON. The output signal Sout is propagated via the first transmission line L1 to the controller unit 23. The device R5 serves for detecting the change in signal level of the output signal Sout. The regulator circuit 21 within the sensor arrangement 30 provides power to the sensor arrangement using the power supplied via the first connection terminal N1.

Even if a mismatch in load occurs between the controller 23 and the sensor arrangement 30, namely even if a capacitance CLoad on the side of the controller unit 23 does not correspond in its capacitance value to a capacitance value of a capacitance C3 on the side of the transmission line L1 which is connected to the sensor arrangement, the proposed shunt driver circuit 20 realizes a rapid transition of the output signal Sout without undershooting its second signal level.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the invention which is defined in the accompanying claims.

I claim:

1. A shunt driver circuit having
a first and a second connection terminal forming a two-wire interface, the first connection terminal being prepared to receive a supply power and to provide an output signal, the second connection terminal being connected to a reference potential terminal, an Operational Transconductance Amplifier, OTA, comprising a first input coupled to the first connection terminal, a second input for receiving a first reference signal and an output for providing a signal depending on a difference between an input signal on the first input and the first reference signal, a capacitor coupled between the output and the first input of the OTA via the second connection terminal in a control loop, and a controlled current source coupled between the output of the OTA and the second connection terminal, wherein the controlled current source is controlled to provide an additional current during a transient phase of the output signal.

2. The shunt driver circuit according to claim 1 further comprising
a first switch connected between the output of the OTA and the first connection terminal, and
a voltage follower coupled between the first and the second connection terminal, the voltage follower having a control input connected to the output of the OTA.

3. The shunt driver circuit according to claim 1 or 2 further comprising
a resistor divider connected between the first and the second connection terminal, the resistor divider having a first and a second resistor connected in series to each other, wherein a connection node between the first and the second resistor is coupled to the first input of the OTA.

4. The shunt driver circuit according to claim 2 further comprising
a circuit for generating a control signal for controlling the controlled current source,
the control signal being generated as a function of a signal at an output terminal of the voltage follower and a second reference signal.

5. The shunt driver circuit according to claim 2 further comprising
a current limiter circuit coupled to the second connection terminal and to another terminal of the voltage follower.

6. The shunt driver circuit according to claim 1, wherein the first reference signal is provided as a function of the output signal.

7. The shunt driver circuit according to claim 2, wherein the voltage follower comprises a first transistor realizing a first voltage follower stage, the first transistor having a control input which forms the control input of the voltage follower.

8. The shunt driver circuit according to claim 2,
wherein the voltage follower comprises a first transistor realizing a first voltage follower stage, the first transistor having a control input which forms the control input of the voltage follower, wherein the voltage follower further comprises at least one second transistor realizing at least one second voltage follower stage, the at least one second transistor being coupled between the first and the second connection terminal and having a control input connected to a terminal of the first transistor.

9. A sensor arrangement having
the shunt driver circuit according to claim 1,
a control logic circuit coupled to the shunt driver circuit for providing an activation signal to control the first switch,
a regulator circuit coupled between the first and the second connection terminal, the regulator circuit being prepared to provide a regulated supply voltage to the sensor arrangement, the regulated supply voltage being provided as a function of the supply power received via the two-wire interface, and
a sensor coupled between the first and the second connection terminal, the sensor being configured to provide a digital sensor signal.

10. A transmission arrangement having
the shunt driver circuit according to claim 1,
a control logic circuit coupled to the shunt driver circuit for providing an activation signal to control the first switch,
a regulator circuit coupled between the first and the second connection terminal, the regulator circuit being prepared to provide a regulated supply voltage to the sensor arrangement, the regulated supply voltage being provided as a function of the supply power received via the two-wire interface, and
a sensor coupled between the first and the second connection terminal, the sensor being configured to provide a digital sensor signal,
a two-wire transmission line connected to the first and the second connection terminal of the shunt driver circuit,
a controller unit connected to the two-wire transmission line, the controller unit having an energy source for providing the supply power, and a device for receiving the output signal.

11. A method for providing an output signal by means of a two-wire interface comprising the following steps:
supplying power to a shunt driver circuit via the two-wire interface,
providing, by the shunt driver circuit, an output signal on the two-wire interface, the output signal having a first signal level,
providing, by a control logic circuit, an activation signal to the shunt driver circuit,
providing, by the shunt driver circuit, the output signal on the two-wire interface, the output signal having a second signal level,
wherein during a transition of the output signal from the first signal level to the second signal level an additional current is provided within the shunt driver circuit.

12. The method according to claim 11,
wherein the activation signal is provided upon detection of activity by a sensor connected to the two-wire interface.

13. The method according to claim 11,
wherein the additional current is adapted to a level of the output signal and is switched off shortly before the output signal assumes the second signal level.

14. The method according to claim 11,
wherein the output signal is provided as a multilevel signal.

* * * * *